United States Patent [19]

Gustafson

[11] 4,229,696
[45] Oct. 21, 1980

[54] SENSOR FOR MEASURING MAGNETIC FIELD CHANGES

[76] Inventor: Adolf G. Gustafson, Musseronvägen 18, 141 46 Huddinge, Sweden

[21] Appl. No.: 936,807

[22] Filed: Aug. 25, 1978

Related U.S. Application Data

[63] Continuation-in-part of Ser. No. 839,901, Oct. 6, 1977, abandoned.

[30] Foreign Application Priority Data

Oct. 12, 1976 [SE] Sweden .......................... 7611326

[51] Int. Cl.³ .......................... G01B 7/14; G01R 33/06
[52] U.S. Cl. .......................... 324/207; 324/228; 324/239
[58] Field of Search ........ 324/207, 208, 228, 229–231, 324/235, 239, 251, 252

[56] References Cited

U.S. PATENT DOCUMENTS

| 2,903,645 | 9/1959 | Wright et al. | 324/230 |
| 3,440,527 | 4/1969 | Steingroever | 324/230 |

FOREIGN PATENT DOCUMENTS

| 45373 | of 1960 | Poland | 324/229 |
| 1144538 | 3/1969 | United Kingdom | 324/229 |
| 198692 | 6/1967 | U.S.S.R. | 324/229 |

Primary Examiner—Gerard R. Strecker
Assistant Examiner—Walter E. Snow
Attorney, Agent, or Firm—Frishauf, Holtz, Goodman & Woodward

[57] ABSTRACT

A sensor for measuring the change of a magnetic field comprises a magnet for generating a constant magnetic flux, and magnetically conductive members magnetically coupled to the magnet for producing first and second magnetic fields, the first magnetic field passing through an object and the second magnetic field not passing through said object, the object being of a material which influences the first magnetic field. A magnetic field measuring device located in the second magnetic field to measure the second magnetic field and to indicate a change in the second magnetic field as a result of the first magnetic field being influenced by the object. A magnetically conductive outer shielding member, which may be one of the magnetically conductive members, is provided.

20 Claims, 10 Drawing Figures

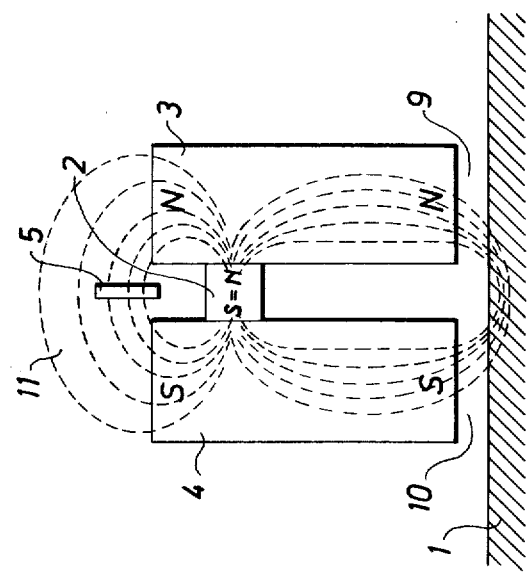
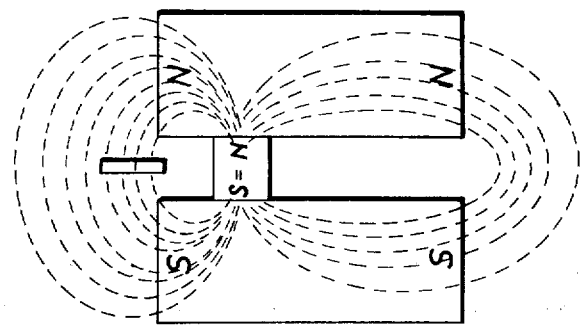

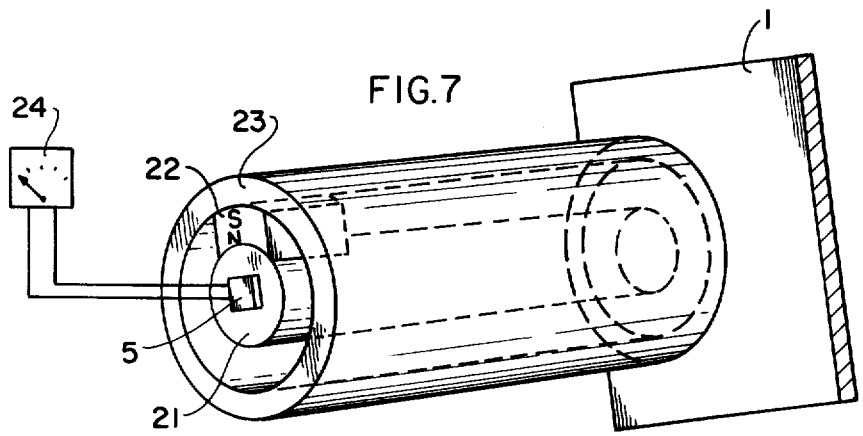
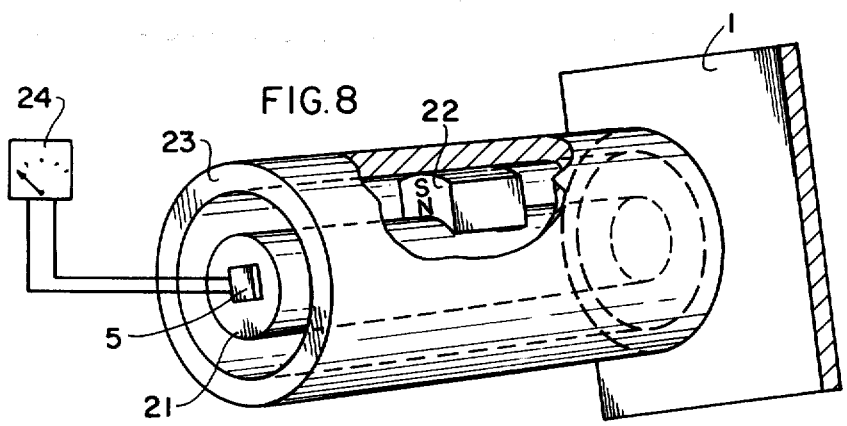
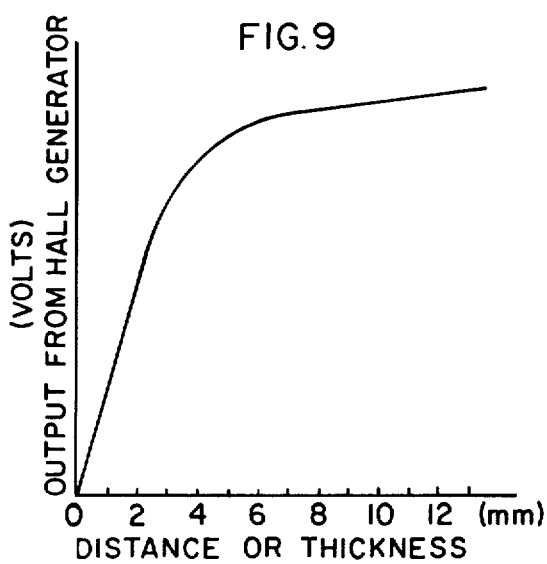
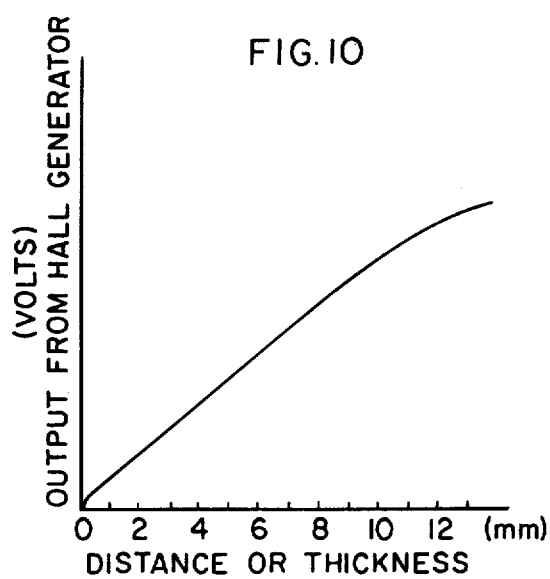

SENSOR FOR MEASURING MAGNETIC FIELD CHANGES

CROSS REFERENCE TO RELATED APPLICATION

This is a continuation-in-part of my prior application Ser. No. 839,901, Oct. 6, 1977, now abandoned.

BACKGROUND OF THE INVENTION

The present invention relates to a sensor for measurement of change of a magnetic field, for example when indicating the distance to a magnetically conductive object or between magnetically conductive objects.

Determination of the distance to a magnetically conductive object by means of measurement of the change of a magnetic field is already known.

In German Offenlegungsschrift No. 2,102,058, for example, is shown a nozzle which provides a ferromagnetic wire with a casing. Inserted in the nozzle is an annular magnet which generates a magnetic field flowing from the north pole of the magnet via the wire, a pole shoe, a focussing point having a measuring element and back to its south pole. By means of the measuring element a direct measure is thus obtained of the distance between the wire and the pole shoe. The disadvantage of this form of direct measurement is that the measuring element must be located in the magnetic path and that such a location is not always possible to attain on account of, for example, lack of space or because the measuring element may be damaged.

Continuous monitoring of the distance to a drive shaft with a large axial path with the aid of Hall generators is also known, for example from German Offenlegunsschrift No. 1,473,854. According to this publication the shaft is provided with magnetic strip located at a mutual distance from each other and having opposite polarities, and at a fixed distance from the shaft a Hall generator is subsequently located. The Hall generator thus directly measures the magnetic field between the magnetic strips and by this means senses the axial play. In this design it is necessary that the shaft be manufactured of a non-magnetic material.

Shown in Swedish Pat. No. 308,211 is a device in a disc mill to measure the distance between the discs. This device utilizes magnets and coils located in the peripheries of the discs and the magnetic field between them constitutes an indication of the distance between them magnet and the coil and thus between the discs. Consequently the mutual distance between the discs is measured at their peripheries but not the air gap between the grinding segments, and since a pulsing output signal is obtained from the coils, it has been deemed necessary to utilize an expensive oscilloscope for reading the output signal. This prior art device is also an example of directly sensing a magnetic field the size of which depends on the distance. Any wear on the magnet thus influences the measured distance.

Another known method of measuring distance is shown in Swedish Pat. No. 359,644. This method utilizes direct measurement of the magnetic field between the objects concerned and a comparative measurement in a second magnetic circuit. This method, also, has the disadvantage in principle that the measuring probe must be inserted directly in the field between the objects the distance between which is to be determined.

According to U.S. Pat. No. 3,849,724 two signals are utilized to determine the distance between two magnetic objects. Here, too, it is preferred that at least one sensor is located in the main magnetic field but also a second sensor is located in the leakage magnetic field. The disadvantage of this type of measuring method is the same as for all other methods mentioned above and the method also requires complicated electronic equipment.

Shown in Swedish Patent application No. 76 12438-7 is a method for detecting the position of moving parts by means of a Hall generator. This prior art method utilizes two permanent magnets and a Hall generator placed between the magnets. This prior art method as the disadvantage that it cannot be used to measure the distance to an object or the distance between two objects and also requires the presence of two permanent magnets in the symmetry fields of which the Hall generator must be located. Similar symmetry arrangements with two permanent magnets are also utilized in other contexts as signal sensors, see for instance the article "Kontaktloser Signalgeber mit berührungsloser Betätigung durch Eisenteile" by H. J. Lippmann on pages 367–372 in ETZ-A 83 (1962):11. The type of signal sensor shown in this last-mentioned publication can only be utilized if an object is approaching the signal sensor and not to measure the distance to an object or between two objects and likewise utilizes two permanent magnets.

The main object of the present invention is to provide a simple and uncomplicated sensor for determination of the distance to a magnetically conductive object or between magnetically conductive objects while avoiding complicated electronics.

Another object of the invention is to provide a sensor which does not need to have the field sensor located in the main magnet field and which can participate in the wear which takes place, for instance between grinding discs, without the measuring result being changed to any appreciable extent.

SUMMARY OF THE INVENTION

In accordance with the present invention, a sensor for measuring the change of a magnetic field comprises a first member for generating a substantially constant magnetic flux, and magnetic flux guiding means coupled to the first member for producing first and second magnetic fields, the first magnetic field passing through an object and the second magnetic field not passing through the object, the object being of a material which influences the first magnetic field. A magnetic field measuring device is located in the second magnetic field to measure the second magnetic field and to indicate a change in the second magnetic field as a result of the first magnetic field being influenced by the object. A magnetically conductive outer shielding member, which may be part of the magnetic flux guiding means, is also provided.

BRIEF DESCRIPTION OF THE DRAWINGS

FIGS. 1a and 1b show the principle for the design of the sensor according to the invention with a magnetic object close to the sensor and removed from it respectively, FIG. 7 shows a still further embodiment of the invention, FIG. 8 shows the embodiment of FIG. 7 with the magnet in a different position, and FIGS. 9 and 10 show the measuring sensitivity curves for the arrangements of FIGS. 7 and 8, respectively.

DETAILED DESCRIPTION

Figure 2:
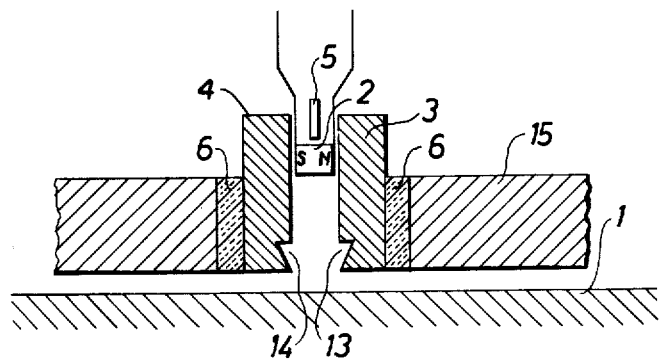
FIGS. 2 and 3 show different embodiments of the sensor according to FIG. 1.

According to FIG. 1 the magnetically conductive object to which, for example, the distance is to be determined is designated with reference numeral 1. A permanent magnet 2 is inserted beneath two magnetically conductive metal pieces or cores 3, 4 which guide the magnetic flux of the magnet 2. The field of the magnet 2 must be adapted to the magnetic conductive capacity of the flux guiding metal pieces 3, 4. The magnet 2 gives rise to two magnetic fields, of which one runs from the north pole—designated N—of the magnet 2 via one metal piece 3, air gap 9, the object 1, air gap 10, the second metal piece 4 and to the south pole—designated S—of the magnet 2. The second magnetic field runs from the north pole N of the magnet 2 via the metal piece 3, air gap 11, the second metal piece 4 and to the south pole S of the magnet 2. Placed in the air gap 11 is a Hall generator 5 or other device for sensing of the magnitude of the magnetic field. The Hall generator 5 or other device can, in principle, be located anywhere within the second field but a preferred location is indicated in FIG. 1. Non-shown wires run obviously from the Hall generator 5 to some form of indicator and/or processing unit to visualize the field change in the air gap 11.

When the sensor according to FIG. 1b is placed close to a magnetically conductive object 1 as is shown in FIG. 1a a mutual change occurs in the two magnetic fields such that the field which passes through the Hall generator 5 decreases to an extent which is dependent on the magnitude of the gaps 9 and 10, i.e. the distance between the object 1 and the ends of the metal pieces 3 and 4.

In an embodiment which is illustrated in FIG. 2 the sensor is mounted in a stationary or possibly rotating grinding disc 15, intended for example to grind a material together with the rotating or stationary disc 1. The sensor is here embedded in nonmagnetic material 6 and the lower ends of the magnetically conductive metal pieces 3 and 4 are notched or bevelled at 13, 14 in the manner shown in FIG. 2 in order to keep the resistance of the sensor to magnetic flux (reluctance) substantially unchanged even if the grinding side of the disc 15 and the sensor's grinding sides become worn.

The notching or bevelling of metal pieces or cores 3 and 4 influences the magnetic resistance since if metal pieces 3 and 4 are worn at their ends, the magnetic resistance of these metal pieces will be decreased because they are shortened in length. This decrease in magnetic resistance is compensated for by a resulting increase in the distance between the ends of the metal pieces 3, 4. Thus, the gap between the ends of the metal pieces 3, 4 is increased when the ends thereof are worn and the result is that the magnetic resistance of the magnetic circuit running from the north pole of the magnet 2 via the metal piece 3, the air gaps, member 1 and via the metal piece 4 to the south pole of the magnet is unchanged as long as the wearing is taking place within the notched or bevelled area of the metal pieces 3 and 4.

Figure 3:
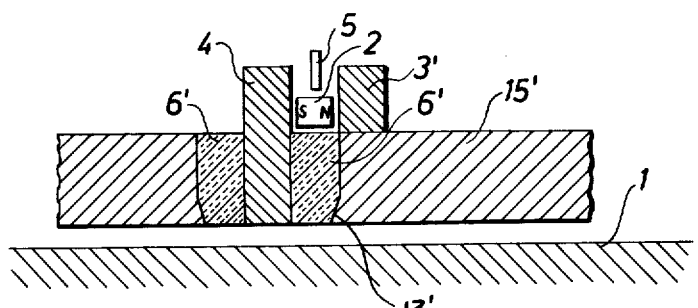

Shown in FIG. 3 is a further embodiment wherein the "metal piece" 3' is included as an undivided part of a grinding disc 15', which is also preferably a magnetically conductive member. Metal piece 3' has additionally been provided with an inward protruding part 13' for the same reason as notches or bevels 13, 14 shown in the embodiment of FIG. 2. The sensor is additionally provided with a metal piece 4 which is embedded in a non-magnetic material 6'. As the surfaces of disc 15' and metal piece 4' adjacent surface 1 wear down, the effective length of metal piece 4' and thickness of disc 15' are shortened, but the spacing between said ends increases, thereby keeping the magnetic resistance of the sensor substantially unchanged.

Figure 4:
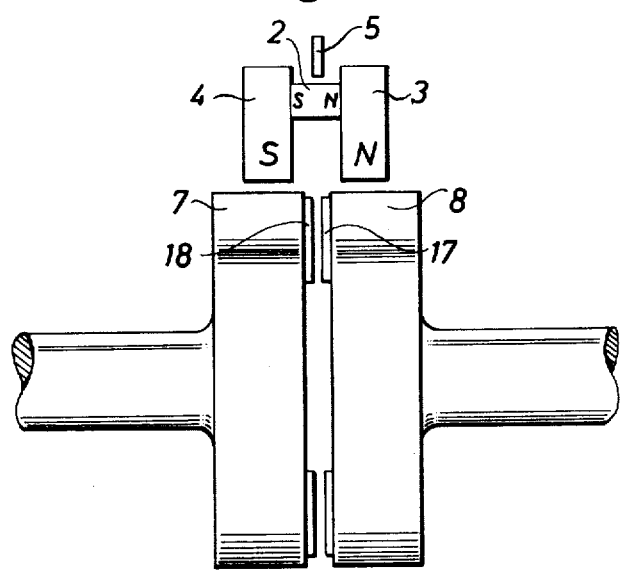
FIG. 4 shows the invention utilized in principle and located outside of the discs between which the air gap is to be determined.

FIG. 4 shows an application of the sensor according to FIG. 1, wherein the grinding clearance between two mutually rotating discs 7 and 8 is to be indicated. It should be noted here that the sensor does not need in any way to be mechanically coupled to or connected with the grinding discs 7 and 8. If the distance between metal piece 4 and disc 7 and between metal piece 3 and disc 8 is substantially constant the reading of the Hall generator 5 for field change will thus be related to the change in the grinding clearance between oppositely facing surfaces of the grinding segments 17, 18.

Figure 5:
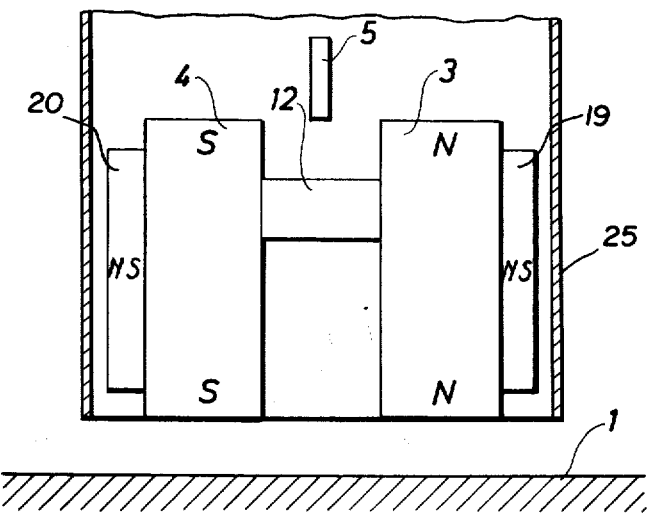
FIGS. 5 and 6 show further embodiments of the invention.
Figure 6:
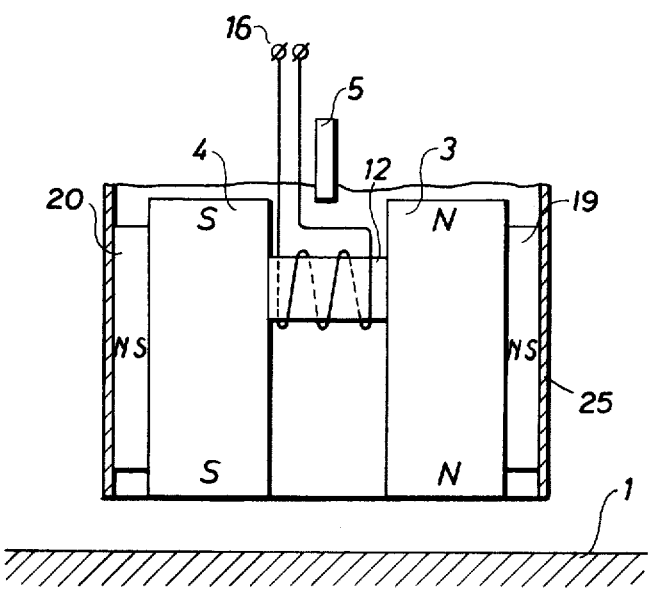

In FIGS. 5 and 6 the permanent magnet 2 according to the other Figures has been replaced by a magnetically conductive piece 12 and the magnetically conductive pieces 3 and 4 have been provided on the outsides with permanent magnets 19, 20. Achieved inter alia by this means is that the sensor according to the invention becomes less sensitive to which material surrounds the sensor, so that to some extent the permanent magnets 19, 20 serve as a screen against the effects of surrounding material.

According to FIG. 6 the magnetically conductive piece 12 has been provided with a winding 16 through which a constant but adjustable direct current can flow to generate a supporting constant magnetic field, for example, in order to thereby change the effective measuring range of the sensor. Obviously, the metal piece 12 and the winding 16 can be replaced if so desired by a permanent magnet. An outer magnetically conductive shield member 25 is provided to prevent environmental electric fields from influencing the measurement. In FIG. 5 the shield 25 is spaced from magnets 19 and 20 and in FIG. 6 the shield 25 contacts the outer surfaces of magnets 19 and 20.

FIG. 7 illustrates a further modification of the invention wherein a Hall generator 5 is mounted on the end of a magnetically conductive rod-shaped member 21 which is coaxially within an outer magnetically conductive member 23. A permanent magnet 22 is interposed between rod 21 and outer cylindrical member 23 so as to be slidable in the axial direction of said rod 21 and outer cylindrical member 23. The magnet 22 may have an interference fit between rod 21 and outer cylindrical member 23 so that it is maintained in the position in which it is placed by frictional forces, or it may be positively located in position, for example by means of an adhesive.

I claim:

1. Sensor for measurement of a distance to a magnetically conductive object comprising:
   means (2; 22; 19, 20) for generating a substantially constant magnetic flux, said magnetic flux generating means including a permanent magnet having north and south poles which are disposed on an axis substantially parallel to the surface of an object (1) the distance to which is to be measured;

magnetic flux guiding means including at least two magnetically conductive magnetic flux guiding members (3, 4; 21, 23) magnetically coupled to said magnetic flux generating means (2; 22) and arranged in the vicinity of said object (1), said magnetic flux guiding means having an end at least adjacent said object (1) and an end remote from said object (1);

said magnetic flux generating means being arranged to provide a first magnetic field passing through said object (1) and a second magnetic field which is directed away from the object (1) and which does not pass through said object (1), said magnetic flux guiding means guiding said first and second magnetic fields in two directions which are mutually opposed by substantially 180°;

an outer magnetically conductive member (15'; 23; 25) surrounding said magnetic flux generating means and at least one of said magnetic flux guiding members to shield said sensor against environmental electric fields, said at least one magnetic flux guiding member being an integral uninterrupted elongated member; and a single magnetic field measuring means (5) located in said second magnetic field and in an air gap positioned close to the end of the magnetic flux guiding means which is located remote from said object (1) so as to substantially not be influenced by heat generated in the vicinity of said object, said first and second magnetic fields varying in mutually inverse relationship as a function of variation in the distance between said object and said sensor;

said permanent magnet being slideably mounted between said at least two magnetic flux guiding members, whereby the position of said permanent magnet relative to said magnetic flux guiding members determines the measuring sensitivity of the sensor.

2. Sensor according to claim 1, wherein said magnetic flux guiding means comprises first (3; 23) and second (4; 21) magnetically conductive flux guiding members which are magnetically coupled to respective poles of said permanent magnet.

3. Sensor according to claim 2, wherein the end of at least one of said magnetically conductive flux guiding members lying nearest said object (1) has a notched or bevelled shape to maintain the reluctance of said sensor substantially constant when said ends become worn down.

4. Sensor according to claim 3 wherein the ends of both of said magnetically conductive flux guiding members lying nearest said object have respective notches or bevels formed therein.

5. Sensor according to claim 3 wherein the end of at least one of said magnetically conductive flux guiding members lying nearest said object has an extending portion which extends toward the other of said magnetically conductive flux guiding members.

6. Sensor according to claim 1 comprising magnetically non-conductive material (6) at least partly embedding said magnetic flux guiding means.

7. Sensor according to claim 1 wherein said outer magnetically conductive member comprises one of said magnetic flux guiding members (23).

8. Sensor according to either of claims 7 wherein said outer magnetically conductive member is cylindrical, and said magnetic flux generating means (22) is interposed between said outer member and another of said magnetic flux guiding means.

9. Sensor according to claim 8 wherein said permanent magnet of said magnetic flux generating means (22) is slidably mounted between said outer magnetically conductive member and another of said magnetic flux guiding means the position of said permanent magnet relative to said magnetic flux guiding means determining the measuring sensitivity of the sensor.

10. Sensor according to claim 1, wherein said outer magnetically conductive member comprises a cylindrical member, and said inner magnetically conductive magnetic flux guiding member comprises a generally rod-shaped member coaxially mounted within said cylindrical member.

11. Sensor according to claim 1, wherein said magnetic field measuring means comprises a single Hall generator (5) located in said second magnetic field.

12. Sensor according to claim 1, wherein said magnetic flux guiding means is spaced from said object (1).

13. Sensor according to claim 1, wherein:
said magnetic flux guiding means comprises at least first (3) and second (4) magnetically conductive members; and
said magnetic flux generating means (2) comprises a first permanent magnet (19) which is magnetically connected to said first magnetically conductive member (3), and a second permanent magnet (20) which is magnetically connected to said second magnetically conductive member (4);
said magnetic flux guiding means further comprising a third magnetically conductive member (12) magnetically connecting said first and second magnetically conductive members together, said third magnetically conductive member (12) being arranged to guide said first magnetic field to run through said object (1) and said second magnetic field to said magnetic field measuring means (5).

14. Sensor according to claim 13, wherein said first and second permanent magnets (19, 20) are located on those sides of the first and second magnetically conductive members (3, 4) located farthest away from each other and from said third magnetically conductive member (12).

15. Sensor according to claim 14, comprising a winding (16) on said third magnetically conductive member (12) for generation of a further substantially constant magnetic flux.

16. Sensor according to claim 13 comprising a winding (16) on said third magnetically conductive member (12) for generation of a further substantially constant magnetic flux.

17. Sensor for measurement of a change of a magnetic field comprising:
means (2) for generating a substantially constant magnetic flux, said magnetic flux generating means comprising a first permanent magnet (19) and a second permanent magnet (20);
magnetic flux guiding means comprising at least first (3) and second (4) magnetically conductive magnetic flux guiding members which are magnetically coupled to said first and second permanent magnets and which are arranged in the vicinity of a magnetically conductive object (1), said first permanent magnet (19) being magnetically connected to said first magnetically conductive member (3), and said second permanent magnet (20) being magnetically connected to said second magnetically conductive member (4);

said first and second magnetically conductive members and said first and second permanent magnets cooperating to provide a first magnetic field passing through said object (1) and a second magnetic field which does not pass through said object (1);

an outer magnetically conductive member ( ) surrounding said first and second permanent magnets and at least one of said first and second magnetically conductive flux guiding members to shield said sensor against environmental electric fields;

a magnetic field measuring means (5) located in said second magnetic field for measuring said second magnetic field, said first and second magnetic fields varying in mutually inverse relationship as a function of variation in the distance between said object and said sensor; and said magnetic flux guiding means further comprising a third magnetically conductive member (12) magnetically connecting said first and second magnetically conductive members (3, 4) together, said third magnetically conductive member (12) being arranged to guide said first magnetic field to run through said object (1) and said second magnetic field to said magnetic field measuring means (5);

said first and second permanent magnets (19, 20) being located on those sides of said first and second magnetically conductive members (3, 4) which are located farthest away from each other and from said third magnetically conductive member (12).

18. Sensor according to claim 17, comprising a winding (16) on said third magnetically conductive member (12) for generation of a further substantially constant magnetic flux.

19. Sensor according to claim 17 wherein said object (1) has a surface in the vicinity of which said magnetic flux guiding means is arranged, said first and second permanent magnets (19, 20) having north and south poles which are disposed on an axis substantially parallel to said surface of said object (1).

20. Sensor according to either of claims 8 or 10 wherein the axis of said cylindrical outer magnetically conductive member is substantially perpendicular to the axis on which the poles of said permanent magnet are disposed.

* * * * *